United States Patent
Junge et al.

(10) Patent No.: US 10,473,741 B2
(45) Date of Patent: Nov. 12, 2019

(54) ATTENUATION CORRECTION IN EMISSION TOMOGRAPHY TAKING INTO ACCOUNT THE HARDWARE PARTS THAT ARE ACTUALLY PRESENT

(71) Applicant: Bruker BioSpin MRI GmbH, Ettlingen (DE)

(72) Inventors: Sven Junge, Ettlingen (DE); Thimo Hugger, Waldbronn (DE)

(73) Assignee: BRUKER BIOSPIN MRI GMBH, Ettlingen (DE)

( * ) Notice: Subject to any disclaimer, the term of this patent is extended or adjusted under 35 U.S.C. 154(b) by 0 days.

(21) Appl. No.: 16/059,577

(22) Filed: Aug. 9, 2018

(65) Prior Publication Data
US 2019/0049539 A1     Feb. 14, 2019

(30) Foreign Application Priority Data
Aug. 9, 2017   (DE) .................... 10 2017 213 874

(51) Int. Cl.
*G01R 33/00*     (2006.01)
*G01R 33/48*     (2006.01)
(Continued)

(52) U.S. Cl.
CPC ........... *G01R 33/481* (2013.01); *G01R 33/00* (2013.01); *G01R 33/46* (2013.01);
(Continued)

(58) Field of Classification Search
CPC .. G01R 33/481; G01R 33/46; G01R 33/5608; G01R 33/5607; G01R 33/00; G01R 33/483; G01T 1/1647; G01T 1/1603
See application file for complete search history.

(56) References Cited

U.S. PATENT DOCUMENTS

| 8,724,875 B2 | 5/2014 | Ojha et al. |
| 2009/0105583 A1 | 4/2009 | Martin et al. |
| (Continued) | | |

FOREIGN PATENT DOCUMENTS

| DE | 102007044874 A1 | 4/2009 |
| DE | 102010024139 A1 | 12/2011 |
| (Continued) | | |

OTHER PUBLICATIONS

German Office Action with English Translation, Application No. 10 2017 213 874.2, dated Jul. 16, 2018, 7 pages.

*Primary Examiner* — Joel Lamprecht
(74) *Attorney, Agent, or Firm* — Edell, Shapiro & Finnan, LLC

(57) ABSTRACT

A method to generate an attenuation correction map to compensate imaging errors in emission tomography resulting from the presence of hardware parts inside the imaging volume of an emission tomograph. Components of 3-dimensional CAD models of the hardware parts to be compensated are converted into voxels on a predetermined grid and assigned a filling factor per voxel. Image data sets of each component are multiplied with respective attenuation coefficients and thereafter superimposed to form an attenuation correction map. Thereby, in a simple and automatable way a profoundly exact, mostly noise-free and exactly reproducible attenuation correction map for attenuation correction in an emission tomography device may be generated.

13 Claims, 3 Drawing Sheets

(51) Int. Cl.
  *G01T 1/16* (2006.01)
  *G01T 1/164* (2006.01)
  *G01R 33/46* (2006.01)
  *G01R 33/56* (2006.01)
  *G01R 33/483* (2006.01)

(52) U.S. Cl.
  CPC ..... *G01R 33/5607* (2013.01); *G01R 33/5608* (2013.01); *G01T 1/1603* (2013.01); *G01T 1/1647* (2013.01); *G01R 33/483* (2013.01)

(56) References Cited

U.S. PATENT DOCUMENTS

| | | | |
|---|---|---|---|
| 2011/0123083 A1* | 5/2011 | Ojha | G01N 24/08 382/131 |
| 2011/0309251 A1 | 12/2011 | Fenchel et al. | |
| 2014/0046171 A1 | 2/2014 | Schmidt | |
| 2014/0163368 A1* | 6/2014 | Rousso | A61B 6/037 600/436 |
| 2014/0221817 A1 | 8/2014 | Aklan et al. | |

FOREIGN PATENT DOCUMENTS

| | | |
|---|---|---|
| DE | 102013104720 A1 | 11/2013 |
| DE | 102012214012 A1 | 2/2014 |
| WO | 2010097714 A2 | 9/2010 |

* cited by examiner

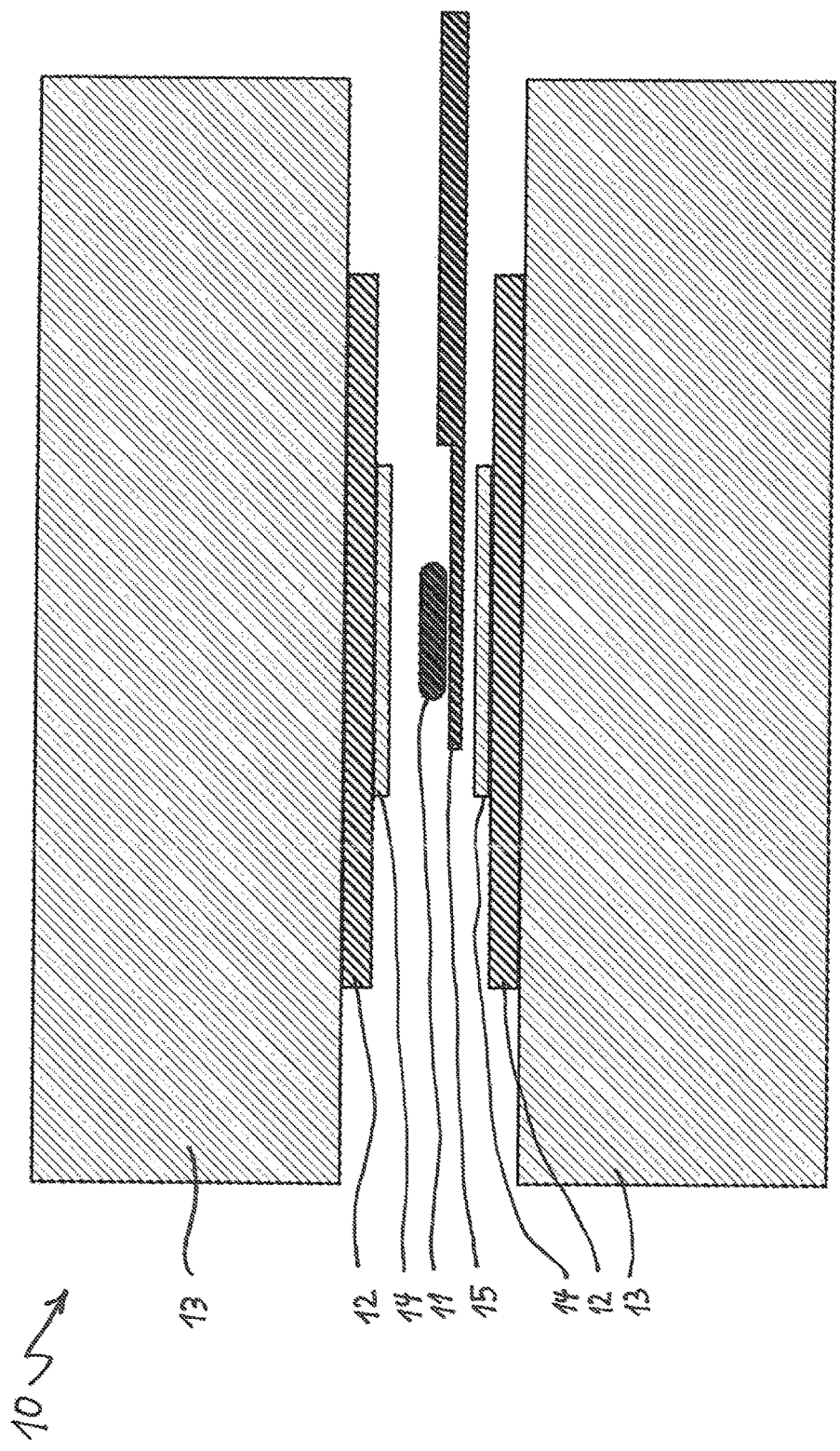

ATTENUATION CORRECTION IN EMISSION TOMOGRAPHY TAKING INTO ACCOUNT THE HARDWARE PARTS THAT ARE ACTUALLY PRESENT

CROSS REFERENCE TO RELATED APPLICATIONS

This application claims foreign priority under 35 U.S.C. § 119(a)-(d) to German Application No. 10 2017 213 874.2 filed on Aug. 9, 2017, the entire contents of which are hereby incorporated into the present application by reference.

FIELD OF THE INVENTION

The invention relates to a method to generate an attenuation correction map in order to compensate image artifacts in emission tomography resulting from the presence of hardware parts inside the imaging volume of an emission tomograph.

Such a method has become known from US 2014/0221817 A1.

BACKGROUND

Methods of emission tomography, like for example Positron Emission Tomography (PET) or Single Photon Emission Computer Tomography (SPECT) are common methods of functional imaging. During an examination, a weakly radio-active substance is administered to a biological sample or to an examined human subject and its dispersion within the organism is made visible, e.g. using PET. In this way, biochemical and physiological functions of the organism may be imaged. In emission tomography, molecules which are marked by a radionuclide are thereby used as radio-pharmaceuticals. As a result of radioactive decays, high energy photons are finally emitted, the directions and energies of which are registered by a multitude of detectors being annularly arranged about the examined subject. From the registered decay events the spatial distribution of the radiopharmaceutical within the body is deduced.

By traversing matter, the photons generated during the decay process may lose energy, be scattered or be absorbed. The respective probabilities for these processes depend on the path-length across matter, on the energy of the photons and on the respective absorption coefficient of the matter. As a consequence, PET requires a correction for the attenuation by components which are located in the beam path in order to deduce the actual radiation dose. The correction of the attenuation requires knowledge of the positions of the attenuating structures which are accounted for in the reconstruction of PET imaging data using an attenuation correction map (attenuation map).

The problems of photon attenuation are not limited to PET but concern emission tomography in general. E.g. the already mentioned Single Photon Emission Computer Tomography (SPECT) above is also encompassed.

Different tissue structures in the body of an organism (bone, fat tissue, air in the lung, etc.) play a central role here, since these different structures also have different attenuation coefficients.

Emission tomography on its own has the disadvantage that it supplies only to a minor extent information about the internal structure of the investigated object. As a consequence, it is often combined with an additional modality, e.g. with computer tomography (CT) or magnetic resonance tomography (MRT). Since CT and MRT feature very different advantages, combined PET-CT as well as combined PET-MRT-devices are in use.

The additional modality is typically used to establish the above-mentioned attenuation correction map. In the example using MRT this is technologically demanding, since there is no direct relationship between the MRT imaging data and the attenuation coefficients.

Hence, by way of example, in MRT-PET devices e.g. segmentation methods are employed in order to identify the tissue structures, in order to generate an attenuation correction map, in which the respective attenuation coefficients are assigned to the segmented tissue types. U.S. Pat. No. 8,724,875 B2, for example, describes such a method.

However, also in an MRT scan hardware parts that are difficult to detect or even invisible pose a problem, e.g. the animal support during pre-clinical imaging, which contribute to the attenuation of photon intensity. Up to now, no respective attenuation correction maps could be established by conventional means.

In the state of the art, methods are known to record the attenuation correction maps of the hardware structures inside the sample volume through direct techniques as e.g. CT and to subsequently superimpose them by the attenuation correction map which had been established with MRT data.

The above-cited US 2014/0221817 A1 is concerned with the problem of photon attenuation due to the diverse hardware parts inside the tomograph. It is suggested to identify the hardware parts optically either through a video control system or by pulsed light measurements (Kinect) or by marking the components for example with an RFID transponder in order to subsequently retrieve the respective, pre-assembled attenuation correction map e.g. from a data base. The publication does not disclose how these maps are created, in particular how the components are generated.

SUMMARY

In contrast, it is an object of the present invention to present a method of the above-mentioned kind using available or at least easily accessible options or to modify a respective method such that in a simple and automatable way a profoundly exact, as much as possible noise-free and exactly reproducible attenuation correction map for attenuation correction in an emission tomography device may be generated taking into account the actually present, known hardware parts of the apparatus which significantly affect the quality of the generated tomograms.

This and other objects are achieved surprisingly easily as well as effectively by a method as mentioned in the beginning comprising at least the following steps:
  (1.a) preparing or providing one or more 3-dimensional computer aided design (=CAD) models of the hardware parts to be compensated;
  (1.b) converting the required components of the CAD models into a 3-dimensional image data set into voxels on a predetermined grid and assigning a filling factor to each voxel;
  (1.c) pointwise multiplying the 3-dimensional image data set of each component with the respective known attenuation coefficient of the material that forms the respective component and the respective energy corresponding to the emission tomography radio tracer used; and (1.d) super-imposing the 3-dimensional image data sets of all components of the hardware parts to be compensated for to form an attenuation correction map.

In the context of the present invention, the term CAD model designates, in general, a computer-readable digital 3-dimensional model. Preferably, these are generated with CAD programs in a narrower sense. However, the expert in the field will also be aware of other kinds to generate digital 3-D models, which will not be elaborated upon here.

The method according to the invention will typically be applied to generate a data base that contains the attenuation correction maps of the known hardware parts. During operation, a control unit will be equipped or programmed, respectively, such that the respective adequate attenuation correction maps of the hardware parts that are currently in use during operation may be selected and appropriately superimposed onto the attenuation correction map which is for example measured via MRT.

Particularly preferred are embodiments of the method according to the invention which are characterized in that in an intermediate step the parts in step (1.b) are triangulated. In this way, less computational effort is required as well as a shorter time of the executing computer program for the subsequent voxelization. Preferably, the 3D model uses triangles, since that is the simplest geometric area shape.

A preferred class of embodiments of the invention concerns a method to perform a total attenuation correction of emission tomography image data sets with an attenuation correction map generated according to the above instruction. This method is characterized by the following steps:
(2.a1) taking a 3-dimensional tomographic data set of an object to be investigated,
(2.a2) generating an attenuation correction map from the 3-dimensional tomographic data set as obtained in (2.a1),
(2.b1) providing one or more attenuation correction maps obtained according to claim 1 or claim 2,
(2.b2) generating a total attenuation correction map by mathematically superposing the attenuation correction map(s) of step (2.b1) with the attenuation correction map of step (2.a2),
(2.c1) generating emission tomography measuring data by taking measurements of the object to be investigated in the emission tomograph,
(2.c2) performing an emission tomography image reconstruction of the measuring data obtained in step (2.c1) by taking into account the total attenuation correction map of step (2.b2).

The data set is intended to represent the anatomy or structure, respectively, of the object. Preferably, this may be a tomographic image. However, the tomographic image need not necessarily be an MRT image, it may also result from other tomographic methods as photon transmission methods, as e.g. CT. Moreover, during measuring step (2.a2) the object to be investigated should reside in a well-defined spatial position.

In advantageous variants of this class of embodiments, prior to step (2. b2) the relative position of the attenuation correction maps obtained in (2.b1) and (2.a2) is determined and the total attenuation correction map is generated in step (2. b2) taking into account the position information of all maps. This increases the accuracy.

Particularly preferred are improvements of this class of embodiments where the generation of the total attenuation map is supported by an automatic recognition of the hardware parts. In this way, the embodiments are less error prone.

Further variants of the method according to the invention are characterized in that in step (2.a2) the attenuation correction map of the object is determined with a segmentation method based on MRI image data. One advantage of MRI measurements is that they show in particular a soft tissue contrast and that they can be combined with measuring methods of emission tomography.

In advantageous further improvements of these variants of the method according to the invention the segmentation method comprises the following sub-steps:
(2.a3) assignment of ranges of the MRI image to known types of material, in particular tissue types, particularly based on information from a data base,
(2.a4) assignment of the identified types of material to specific attenuation coefficients, in particular based on information from a data base,
(2.a5) generation of a material specific attenuation map of the object to be investigated based on the measured MRT image.

Segmentation methods of this kind have the potential to achieve a high accuracy in generating the attenuation map. However, it may turn out to be a disadvantage that a fully automated segmentation, doing completely without any user interaction, becomes more and more difficult with an increasing number of segments.

Further advantageous variants of the class of embodiments described above are characterized in that the attenuation correction map of the object is determined with an atlas-based method relying on MRT image data.

Preferably, in an atlas-based method several data sets which are equipped with an attenuation correction map are stored in a library. From this library, the particular data set is selected that fits the image data set best. One possible embodiment consists of achieving the possibly best fit between each library data set and the image data set using a suitable geometric distortion. The degree of consistency is quantified for each data set. Finally, that particular data set is selected that exhibits the best fit. The corresponding attenuation correction map is subjected to the same geometric distortion as the data set. Subsequently, this represents the attenuation correction map of the object to be used finally.

Advantage: atlas-based methods with which the actually measured image data sets are fitted to already available data sets, e.g. of a respective library, require little technical effort.

Disadvantage: It is a necessary requirement that in the first place the data base actually contains an attenuation map for the object to be investigated (i.e. with a high degree of consistency of structure or morphology, respectively).

Alternative method variants are characterized in that the attenuation correction map of the object is determined with a photon transmission measurement. The photon source may thereby be an x-ray source or a radioactive gamma-emitter, advantageously render possible a direct measurement of the attenuation coefficients.

The scope of the present invention also covers a combined emission tomography apparatus comprising
a device to take 3-dimensional tomographic data sets of an object to be investigated as well as an emission tomography device with a defined arrangement of detector elements to detect kinetic parameters of photons emitted out of a sample volume,
whereby the combined apparatus is equipped to sequentially or simultaneously take a 3-dimensional tomographic data set as well as an emission tomography image of the same object to be investigated, each in a defined measuring position within the combined apparatus, which is characterized in that
the combined apparatus is equipped to perform a total attenuation correction of emission tomography data sets with a variant of the inventive method described above.

Preferably, the combined emission tomography apparatus comprises a data base containing the attenuation correction maps of the known hardware parts. During operation, a control unit is equipped or programmed, respectively, such that the respective adequate attenuation correction maps of the hardware parts that are currently in use during operation may be selected and appropriately super-imposed onto the attenuation correction map—which is for example measured using CT or MRT.

Particularly preferred is an embodiment of this combined emission tomography apparatus, where the device to take 3-dimensional tomographic data sets is an MRT device comprising a magnet to generate a homogeneous magnetic field $B_0$ in a measuring volume, a gradient coil system to generate magnetic field gradients inside the measuring volume, and a high frequency excitation and detection coil system to irradiate high frequency pulses into the measuring volume and to read the measuring volume. As already explained above, MRT provides soft tissue contrasts and may be combined with a multitude of different emission tomography measuring methods.

Finally, an alternative embodiment of combined emission tomography is characterized in that the device to take 3-dimensional tomographic data sets is a computer tomography device, comprising an x-ray source and a detector unit, which are arranged movably, preferably rotatably, with respect to each other in such a way that a 3-dimensional data set of an object to be investigated positioned between x-ray source and detector unit may be taken. A particular advantage is that the combination PET/CT exhibits complementary contrast characteristics compared to the combination PET/MRT, such that both embodiments cover different ranges of application.

In principle, the desired data set may also be taken using other photon transmission methods. For example, methods that are essentially identical to CT, but the x-ray source is replaced by a radio-active gamma-emitter, are also known in the prior art. However, the described method to generate a total attenuation correction map is particularly advantageous for the combination MRT and PET, since the direct determination of attenuation coefficients is not possible using MRT.

Further advantages of the invention result from the specification and the drawings. Likewise, the features referred to above and the further features set out here may each be used according to the techniques taught herein alone or several may be used in any combination. The embodiments shown and described should not be understood as a definitive listing, but rather as examples for the presentation of the invention.

BRIEF DESCRIPTION OF THE DRAWINGS

The invention is illustrated in the drawings and will be described in more detail with reference to various embodiments. The figures show:

FIG. 3 a schematic longitudinal cut representation of the essential parts of a state-of-the-art combined PET-MRT system, with which the method according to the invention may be performed.

DETAILED DESCRIPTION

Figure 1:
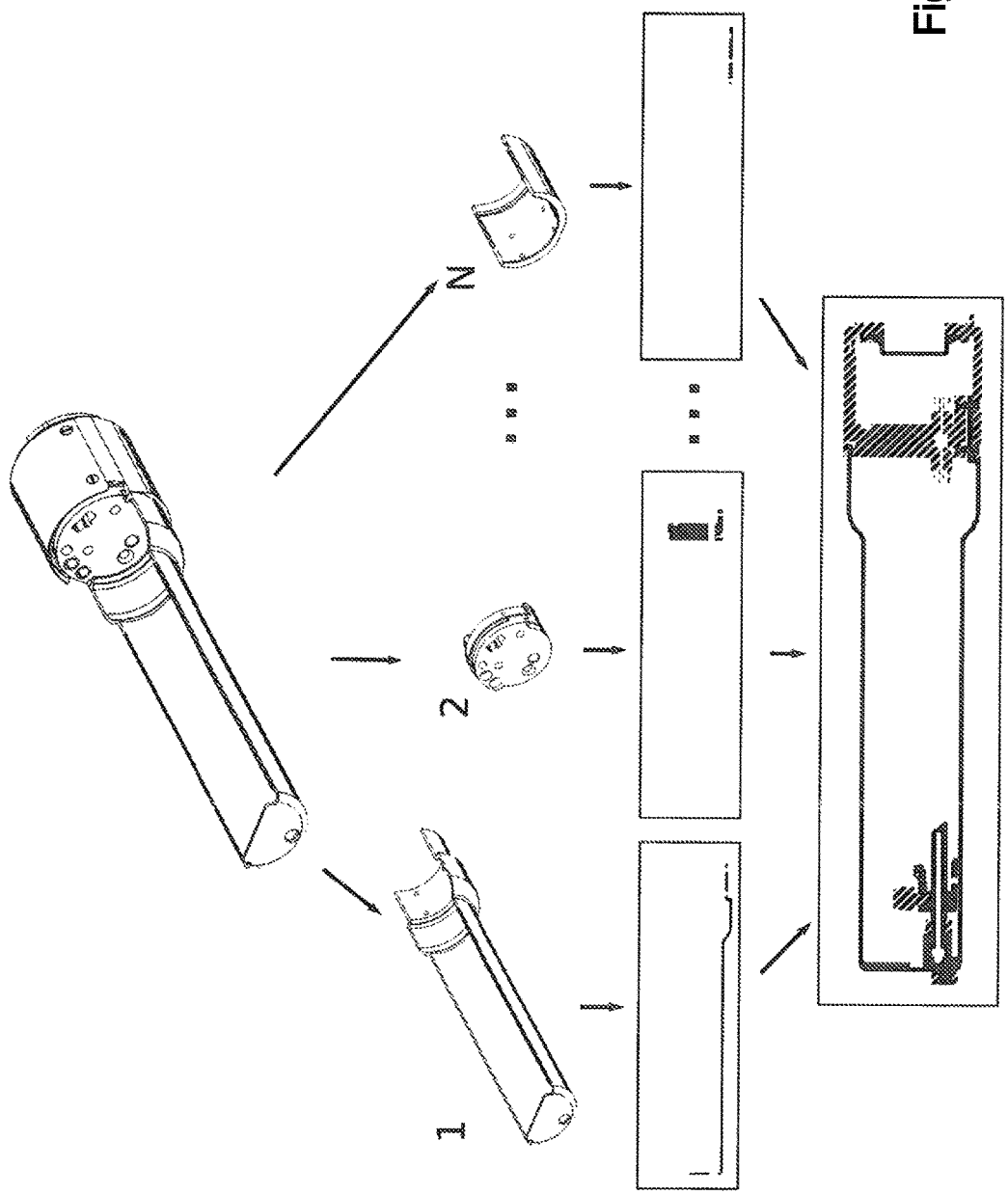
FIG. 1 a schematic representation of the inventive method to generate an attenuation correction map, here for a hardware part assembled from several partial elements using 3-dimensional CAD data.

A primary aspect of the present invention is a method to generate an attenuation correction map to compensate emission tomography imaging errors resulting from present hardware parts inside the imaging volume of an emission tomograph. The method according to the invention serves in particular to improve the use of a combined emission tomography apparatus which, apart from an emission tomography device, comprises also in addition at least one device to take 3-dimensional tomographic data sets of an object to be investigated.

One object of the invention is the generation of a profoundly exact, as much as possible noise-free and exactly reproducible attenuation correction map for attenuation correction in an emission tomography device may be generated taking into account the actually present, known hardware parts of the apparatus which significantly affect the quality of the generated tomograms.

To this end, the following steps are performed according to the invention:

(1.a) preparing or providing one or more 3-dimensional CAD models of the hardware parts to be compensated;

(1.b) converting the required components of the CAD models into a 3-dimensional image data set into voxels on a predetermined grid and assigning a filling factor to each voxel;

(1.c) pointwise multiplying the 3-dimensional image data set of each component with the respective known attenuation coefficient of the material that forms the respective component and the respective energy corresponding to the emission tomography radio tracer used; and (1.d) super-imposing the 3-dimensional image data sets of all components of the hardware parts to be compensated for to form an attenuation correction map.

In converting step (1.b) the components may be triangulated in an intermediate step in order to reduce the computing effort and to thereby increase the speed of the method.

The attenuation correction map as generated according to the invention may then be employed in a method to perform a total attenuation correction of emission tomography image data sets with the following steps:

(2.a1) taking a 3-dimensional tomographic data set of an object to be investigated, (2.a2) generating an attenuation correction map from the 3-dimensional tomographic data set as obtained in step (2.a1), (2.b1) providing one or more attenuation correction maps obtained according to claim 1 or claim 2, (2.b2) generating a total attenuation correction map by mathematically superimposing the attenuation correction map(s) of step (2.b1) with the attenuation correction map of step (2.a2), (2.c1) generating emission tomography measuring data by taking measurements of the object to be investigated in the emission tomograph, (2.c2) performing an emission tomography image reconstruction of the measuring data obtained in step (2.c1) by taking into account the total attenuation correction map of step (2.b2).

Preferably, prior to step (2.b2) the relative positions of the attenuation correction maps obtained in steps (2.b1) and (2.a2) are determined and the total attenuation correction map is generated in step (2.b2) accounting for the position information of all maps. The generation of the total attenuation correction map may be based on an automatic recognition of the hardware parts.

An exemplary representation of the method according to the invention is shown schematically in FIG. 1. Not shown as such in FIG. 1 is a CAD data file of the hardware part represented 3-dimensionally in the uppermost 1. level of the figure, which, in the present exemplary embodiment, is an animal support to hold a laboratory animal during tomographic measurements.

The 2. Level of FIG. 1 indicates how this hardware part is—notionally—fragmented into its N known single elements 1, 2, . . . N.

Each single element is computationally converted into an attenuation map, i.e. voxelized, as can be seen in the 3. level of FIG. 1. However, for clarity reasons of the representation in this 3. level, only 1-dimendional voxel images are shown. In reality, however, the respective data sets are 3-dimensional.

Subsequently, all attenuation maps of the N single elements are superimposed to a total attenuation map of the total hardware part, which is indicated in the 4. Level of FIG. 1—again only 1-dimensionally.

Figure 2:
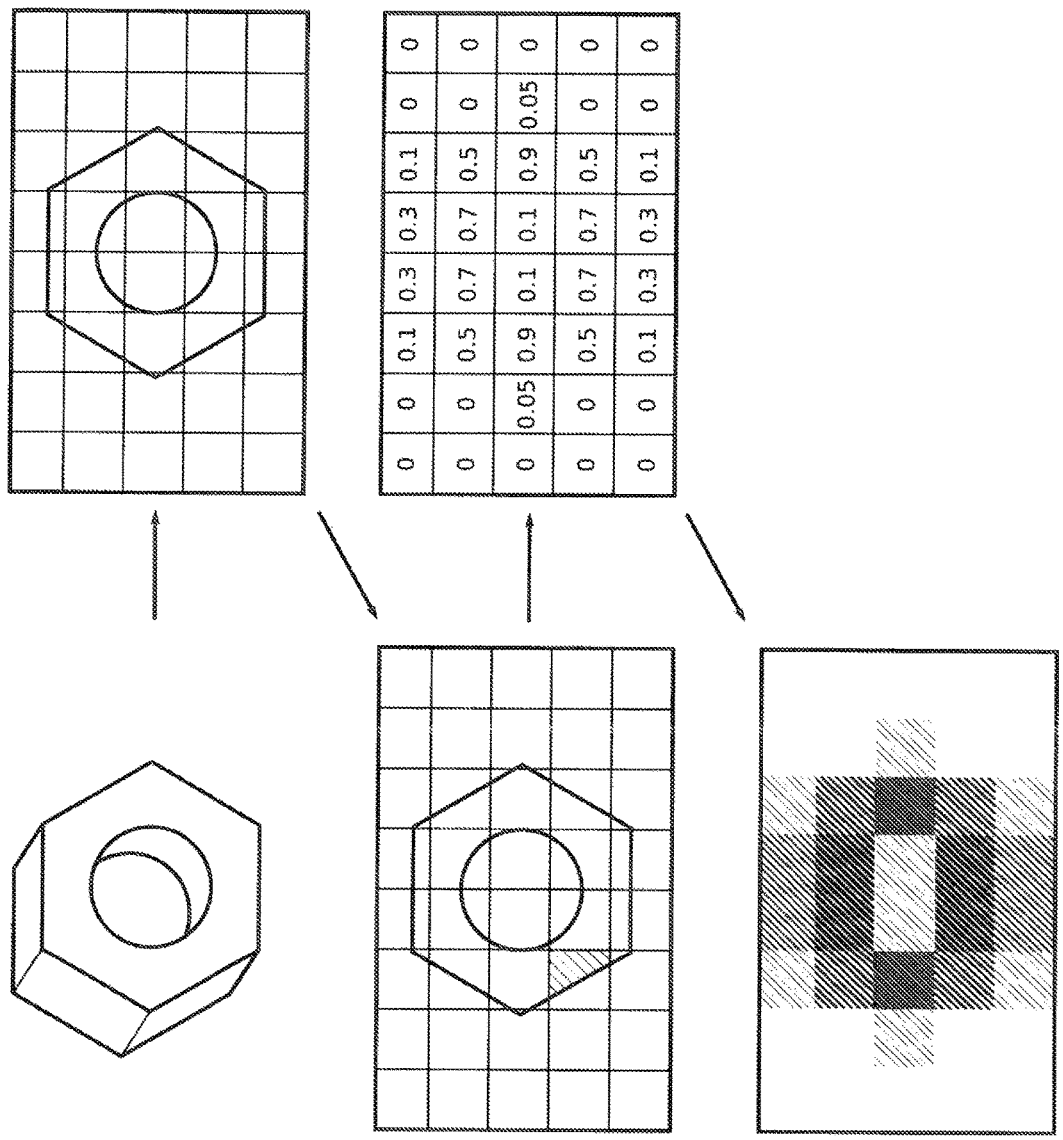
FIG. 2 a detailed representation of the voxelization step of level 3 of the flow chart of FIG. 1, exemplified on a fictitious, schematic part in form of a hex nut.

FIG. 2 shows a detailed representation of the voxelization step of level 3 of the flow chart of FIG. 1, exemplified for a fictitious, schematic part (in the present example a fictitious hex nut, as indicated in the 1. picture of FIG. 2). For the sake of a simpler presentation, the process is shown 2-dimensionally in a section plane of the 3-dimensional part.

The part is mathematically superimposed by a 3-dimensional grid (see 2. picture of FIG. 2).

The voxels defined by the grid each have a filling factor between 0 and 1, representing the "degree of overlap" with the part. In the 3. Picture of FIG. 3 this is exemplified for an arbitrary voxel.

For each voxel the filling factor is determined. This results in a complete 3-dimensional filling factor map of the part (indicated in the 4. picture of FIG. 2).

Through point-wise multiplication of the total filling factor map with the attenuation coefficient of the material forming the part, the attenuation map of the part results (depicted schematically in the hatched greyscales in the 5. and last picture of FIG. 2).

FIG. 3, finally, shows a schematic longitudinal cut representation of a state-of-the art combined PET-MRT system, which may serve to perform the method according to the invention. The combined emission tomography apparatus 10 shown in FIG. 3 comprises a device to take 3-dimensional tomographic data sets of an objects 11 to be investigated as well as an emission tomography device 12 with a defined arrangement of detector elements to detect kinetic parameters of photons emitted out of a sample volume. The combined apparatus 10 is equipped to sequentially or simultaneously take a 3-dimensional tomographic data set as well as an emission tomography image of the same object 11 to be investigated, each in a defined measuring position within the combined apparatus 10.

The parts of the cylinder symmetrical in FIG. 3—comprise—from radially innermost outwards—a) a measuring object 11 positioned on a support 15 or a sliding bed, respectively, b) an RF excitation and detection coil system 14 of an MRT device to generate a homogeneous NMR magnetic field $B_0$ inside the measuring volume and to detect the MR signal, c) an emission tomography device 12, e.g. a PET arrangement, as well as d) an MRT-magnet system 13 including a gradient coil system (not specifically depicted) to generate magnetic field gradients inside the measuring volume.

REFERENCE NUMBER LIST

10 combined emission tomography apparatus
11 object to be investigated
12 emission tomography device
13 NMR magnet
14 RF excitation and detection coil system
15 support

What is claimed is:

1. A method for generating an attenuation correction map, to compensate imaging errors in emission tomography resulting from hardware parts present inside an imaging volume of an emission tomograph, comprising:
    (1.a) preparing or providing at least one 3-dimensional computer-aided design (CAD) model of the hardware parts being compensated;
    (1.b) converting required components of the CAD model into a 3-dimensional image data set into voxels on a predetermined grid and assigning a filling factor to each voxel;
    (1.c) pointwise multiplying the 3-dimensional image data set of each of the components with a respective known attenuation coefficient of the material that forms the respective component and a respective energy corresponding to an emission tomography radio tracer being used; and
    (1.d) super-imposing the 3-dimensional image data sets of all components of the hardware parts being compensated, to form at least one attenuation correction map.

2. Method according to claim 1, further comprising, in an intermediate step, triangulating the hardware parts in step (1.b).

3. A method for performing a total attenuation correction of emission tomography image data sets with the attenuation correction map generated according to claim 1, comprising:
    (2.a1) obtaining a 3-dimensional tomographic data set of an object being investigated,
    (2.a2) generating at least one attenuation correction map from the 3-dimensional tomographic data set obtained in (2.a1),
    (2.b1) providing the at least one attenuation correction map formed according to claim 1,
    (2.b2) generating a total attenuation correction map by mathematically superposing the at least one attenuation correction map of step (2.b1) with the at least one attenuation correction map of step (2.a2),
    (2.c1) generating emission tomography measuring data by taking measurements of the object being investigated in the emission tomograph,
    (2.c2) performing an emission tomography image reconstruction of the measuring data generated in step (2.c1) by taking into account the total attenuation correction map of step (2.b2).

4. Method according to claim 3, further comprising, prior to step (2.b2), determining the relative position of the attenuation correction maps obtained in steps (2.b1) and (2.a2), and generating the total attenuation correction map in step (2.b2) by taking into account position information of all the maps.

5. Method according to claim 3, wherein the generating of the total attenuation map is supported by an automatic recognition of the hardware parts.

6. Method according to claim 3, wherein, in step (2.a2), the attenuation correction map of the object is determined with a segmentation method based on MRI image data.

7. Method according to claim 6, wherein the segmentation method comprises:
   (2.a3) assigning ranges of the MRI image to known types of material,
   (2.a4) assigning the identified types of material to specific attenuation coefficients, and
   (2.a5) generating a material-specific attenuation map of the object being investigated based on the measured MRI image.

8. Method according to claim 7, wherein the known types of material comprise tissue types based on information from a data base, and wherein the specific attenuation coefficients are based on information from a data base.

9. Method according to claim 3, wherein the attenuation correction map of the object is generated with an atlas-based method relying on MRI image data.

10. Method according to claim 3, wherein the attenuation correction map of the object is generated with a photon transmission measurement, selected from computer tomography (CT), positron emission tomography (PET), and single photon emission computer tomography (SPECT).

11. A combined emission tomography apparatus comprising:
   a device configured to take 3-dimensional tomographic data sets of an object being investigated,
   an emission tomography device with a defined arrangement of detector elements,
   configured to detect kinetic parameters of photons emitted out of a sample volume,
   wherein the combined apparatus is configured to sequentially or simultaneously take a 3-dimensional tomographic data set as well as an emission tomography image of a same object being investigated,
   wherein each device is in a defined measuring position within the combined apparatus, and
   wherein the combined apparatus is equipped to perform a total attenuation correction of emission tomography image data sets in accordance with the method claimed in claim 3.

12. The combined emission tomography apparatus according to claim 11, wherein the device configured to take 3-dimensional tomographic data sets is an MRI device comprising:
   a magnet configured to generate a homogeneous nuclear magnetic resonance (NMR) magnetic field $B_0$ in a measuring volume,
   a gradient coil system configured to generate magnetic field gradients inside the measuring volume, and
   a high frequency excitation and detection coil system configured to irradiate high frequency pulses into the measuring volume and to read the measuring volume.

13. The combined emission tomography apparatus according to claim 11, wherein the device configured to take 3-dimensional tomographic data sets is a computer tomography device comprising:
   an x-ray source and a detector unit, which are arranged movably with respect to each other and which are configured to take a 3-dimensional data set of an object which is being investigated and which is positioned between the x-ray source and the detector unit.

* * * * *